United States Patent [19]

McKenna et al.

[11] 4,183,780
[45] Jan. 15, 1980

[54] PHOTON ENHANCED REACTIVE ION ETCHING

[75] Inventors: Charles M. McKenna, Fishkill; H. Keith Willcox, Poughkeepsie, both of N.Y.

[73] Assignee: International Business Machines Corporation, Armonk, N.Y.

[21] Appl. No.: 934,733

[22] Filed: Aug. 21, 1978

[51] Int. Cl.² .................. H01L 21/306; C03C 15/00; C03C 25/06

[52] U.S. Cl. .................. 156/643; 118/722; 156/345; 156/646; 204/192 C; 204/192 E; 250/531; 427/38

[58] Field of Search .............. 156/345, 639, 643, 646, 156/657, 662; 204/192 C, 192 EC, 192 E, 164, 298; 427/35, 38, 39, 54; 118/49.1, 49.5; 250/492, 531

[56] References Cited

U.S. PATENT DOCUMENTS

| | | | |
|---|---|---|---|
| 3,095,332 | 6/1963 | Ligenza | 148/1.5 |
| 3,095,341 | 6/1963 | Ligenza | 156/646 |
| 3,303,319 | 2/1967 | Steigerwald | 219/121 |
| 3,551,213 | 12/1970 | Boyle | 148/1.5 |
| 3,738,926 | 6/1973 | Westwood et al. | 204/298 |
| 3,791,952 | 2/1974 | Labuda et al. | 204/192 |
| 3,918,383 | 11/1975 | Hahn | 427/38 |
| 4,123,663 | 10/1978 | Horiike | 204/192 E |

Primary Examiner—William A. Powell
Attorney, Agent, or Firm—John A. Jordan

[57] ABSTRACT

A method and apparatus for modifying a surface, by either plasma etching the surface or plasma depositing a material thereon, by using vacuum ultraviolet radiation to control the modification of the surface.

15 Claims, 5 Drawing Figures

PHOTON ENHANCED REACTIVE ION ETCHING

DESCRIPTION

TECHNICAL FIELD

This invention relates to plasma technology for use in either plasma etching the surface of a substrate or depositing material from the plasma on the substrate. More particularly, this invention relates to the use of vacuum ultraviolet radiation during etching or deposition.

Accordingly, it is a primary object of the present invention to provide an apparatus and process which permits real time control of plasma etching and deposition.

Another object of the present invention is to provide an apparatus and process which controls the disassociation of the plasma species adjacent the substrate to be etched or on which a layer is to be deposited.

A further object of the present invention is to provide an apparatus and method which permits control of plasma species, such as stable organic halides and molecular oxygen and fluorine.

A still further object of the present invention is to provide an apparatus and method which permits selection of particular plasma species for disassociation.

Another object of the present invention is to provide an apparatus and method which permits control of plasma etching and deposition in selected areas of the substrate.

BACKGROUND ART

In semiconductor manufacturing, etching is required to expose areas of the silicon substrate for diffusion or ion implantation of impurities so as to form integrated circuits in the silicon substrate. One method of etching is by a process of plasma etching or reactive ion etching. In this process, a chemically reactive gas such as $CF_4$ is used. The surface of the substrate to be etched is covered with a mask, leaving selected areas of the surface exposed. The substrate with a surface to be etched is inserted into a chamber containing the reactive gas. To create the plasma, normally an RF voltage is applied across the gas to cause the gas to disassociate and form various species, such as a positive and negative ions, atoms, such as fluorine, and radicals. The plasma reacts with the surface and forms volatile products, thereby leaving an etched surface in the exposed areas.

By changing the gas and the conditions, as is well known in the art, plasma can be used for depositing a layer on the substrate rather than etching the surface of the substrate.

Plasma etching and deposition rate are dependent on the RF power and frequency (if the power source is RF) gas pressures and compositions, temperature, substrate bias, and gas flow dynamics. Varying any of the above parameters does not permit real time control of the plasma etching or deposition. Yet, such control is desirable. For example, as the plasma etching approaches a critical material interface, it is preferable to slow the etch rate.

Highly reactive species, such as halogen and oxygen, especially in their atomic state, whether neutral or ionized, are desirable in plasma etching. Atomic fluorine in a plasma created from a gas of $CF_4$ with a small percentage of oxygen is believed to react with silicon and the oxides and nitrides of silicon according to the following reactions:

$$CF_4 \rightarrow C + 4F\stackrel{O_2}{\rightarrow}CO_2 + 4F$$

$$4F + Si \rightarrow SiF_4$$

$$4F + SiO_2 \rightarrow SiF_4 + O_2$$

$$12F + Si_3N_4 \rightarrow 3SiF_4 + 2N_2$$

The etching or ashing of organic material, such as photoresist, also is preferably achieved with atomic oxygen. A general reaction would be as follows:

$$C_xH_y + 3O \rightarrow CO_2 + H_2O$$

Because of the opacity of air (as well as various glass, quartz, and crystalline window materials) below wavelengths of about 2000 Å and the consequent need to operate in a vacuum, this region of the electromagnetic spectrum is commonly called vacuum ultraviolet. The wavelength range corresponds to a photon energy range of 60 KeV to 6 eV. The ionization potentials of most organic compounds, such as $CF_4$, lie in the energy range 8–13 eV so that organic molecules which absorb vacuum ultraviolet wavelengths will form ion species.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

In order to achieve the foregoing objects of the present invention, the plasma reactor includes means for emitting selected wavelengths of vacuum ultraviolet and directing this radiation to the species of plasma, preferably adjacent the substrate, so as to cause a change in, at least, selected species and thereby control the plasma process, especially at the substrate. More specifically, the preferred plasma species for reactive ion etching are $O_2$, $F_2$ and stable organic halides, such as $CF_4$, which require wavelengths in the vacuum ultraviolet for photoionization and disassociation. The plasma species for deposition also require the wavelengths to be in the vacuum ultraviolet regions of the electromagnetic spectrum.

BEST MODE FOR CARRYING OUT THE INVENTION

Figure 1:
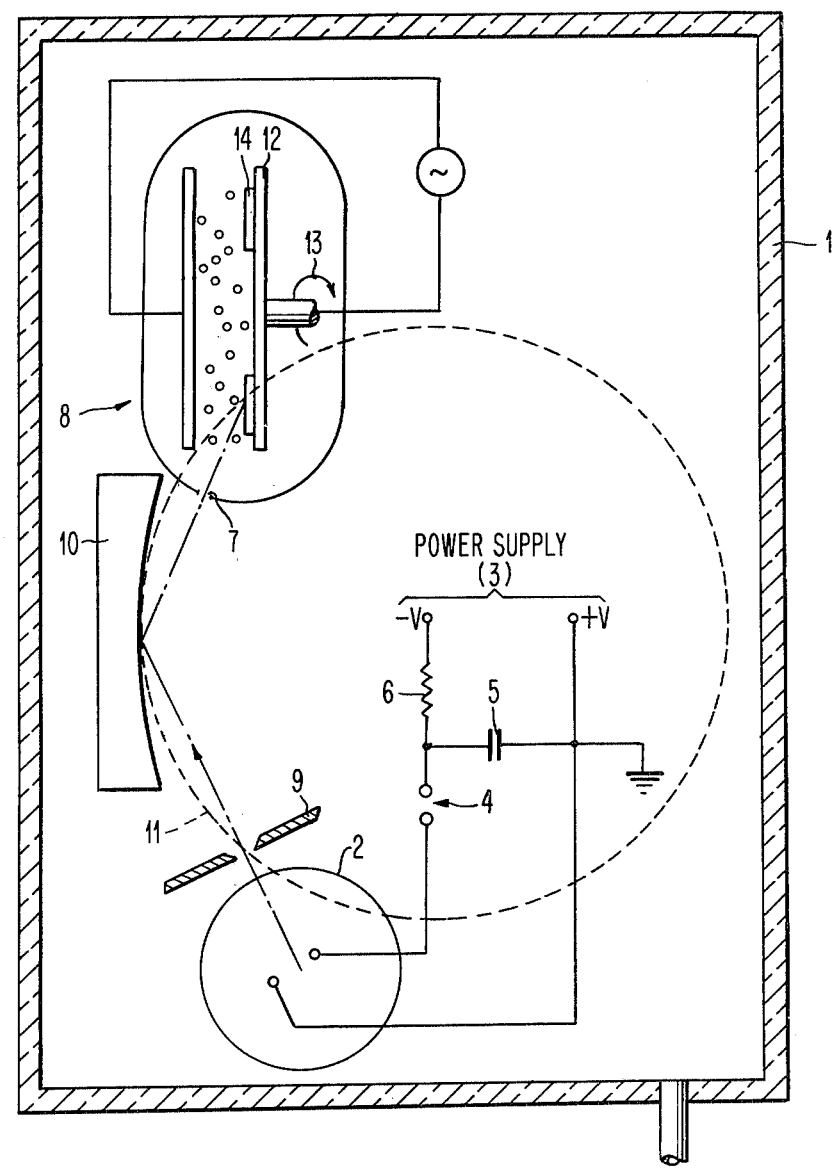
FIG. 1 is a schematic cross-sectional view of the preferred vacuum ultraviolet generating means in combination with the plasma reactor.

As shown in FIG. 1, enclosed in a vacuum chamber 1 the means for generating vacuum ultraviolet radiation, is a Hopfield type repetitive spark discharge source 2 of vacuum ultraviolet having a continuum wavelength range of 600 to 1000 Å. The source 2 includes power supply 3 and a spark gap 4, which breaks down when the voltage across the capacitor 5 is sufficiently great. The time required to charge the capacitor is determined by the time constant of the capacitor 4 and the resistor 6, the product of which determines the repetition rate. If desired, the spark gap 4 can be replaced by a thyratron circuit. Contained in the source 2 is purified helium which, during breakdown of spark gap 4, emits a continuum spectrum extending from 600 to 1000 Å. A more preferred means for generating vacuum ultraviolet radiation is a duoplasmatron as described in FIG. 3. It can be substituted for the Hopfield type source 2. The vacuum ultraviolet continuum passes through an entrance slit 9 of a monochromator and is reflected and focused by a concave grating 10 through the exit slit 7 in the plasma reactor 8 and is absorbed by the plasma species adjacent the article, herein a silicon wafer carrying a $SiO_2$ layer to be selectively etched. Typical intensity at the exit slit 7, of a mono-chrometer having 0.5 Å band pass is of the order of $10^8$ photons/sec. The exit slit 7, entrance slit 9, and the grating 10 are mounted on a circle shown by the dashed lines 11 which is known as the Rowland circle. By rotating these optical components 7, 9 and 10 of the monochromator along the Rowland circle, different wavelengths from the continuum spectra can be selected so as to match the absorption wavelength of the plasma species, herein $CF_4$, to cause disassociation and provide fluorine atoms for etching the $SiO_2$. Because the vacuum ultraviolet source can be turned on or off at any time during the plasma etching (or deposition) process, the etching can be controlled on a real time basis.

Except for the modification of the exit slit 7 in the wall of the plasma reactor 8, the reactor can be any one of a number of commercial reactors or the reactor described in Application Ser. No. 865,811, filed Dec. 30, 1977. However, the carrier 12 of the reactor 8 should be movable, herein rotatable as shown by the arrow 13, so as to position different portions of the article to be etched and different articles under the vacuum ultraviolet beam. In this way, selected portions of the article can be etched at a different rate. Also, the deposition rate on selected portions of the article can be varied by exposing selected portions of the article. Further details regarding the spark gap source of vacuum ultraviolet and monochromator can be found in Techniques of Vacuum Ultraviolet Spectroscopy, by James A. R. Samson, published by John Wiley & Sons (1967).

In operation herein, the article to be etched (or have a layer deposited thereon) is placed in the plasma reactor 8 in the normal $CF_4+O_2$ environment.

During conventional etching, the vacuum ultraviolet beam is turned on to maximize the etching rate initially by generating additional fluorine atoms for etching by disassociation of the $CF_4$ and oxygen atoms by the disassociation of $O_2$ to combine with carbon atoms to form $CO_2$ gas. The beam is turned off as the etching approaches its end point to slow the etch rate. Of course, the beam can be turned on or off at anytime so as to alter the etch profile or for any other reason which requires control of the etching on a real time basis. The same is true during a deposition process.

In the etch process, the substrate preferably is one wherein all the components are capable of forming volatile substances under the conditions of the etching process. Moreover, the etchant should be a material whose etching characteristics are activated or greatly enhanced by the presence of radiation under the common operating pressures and temperatures. This normally will necessitate an absorption spectra of the material which encompasses the wavelength(s) of the vacuum ultraviolet beam so that disassociation will occur for etching (the same being true for deposition). The spectra of desired etchants can be found in Some Aspects of Vacuum Ultraviolet Radiation Physics by B. Vodar and J. Romand, Pergamon Press (1974) and Chemical Spectroscopy and Photochemistry in the Vacuum-Ultraviolet by Sandorfy, Ausloos and Robin, D. Reidel Publishing Co. (1974).

The preferred etchant employed in the present process is $CF_4$. However, $F_2$ may also be used as an etchant and a source of fluorine atoms. In ashing photoresist, $O_2$ is the preferred etchant.

Of course, the process is carried out under vacuum conditions, normally at pressures of $5 \times 10^{-3}$ torr to about $5 \times 10^{-1}$ torr. The minimum flow rate of the etchant is generally determined by the desired etch rate. The maximum flow rate is primarily determined by the capacity of the pumping system. Room temperature (e.g. about 300° K.) is preferred for the process of the present invention, but higher temperatures can be employed when desired.

Figure 2:
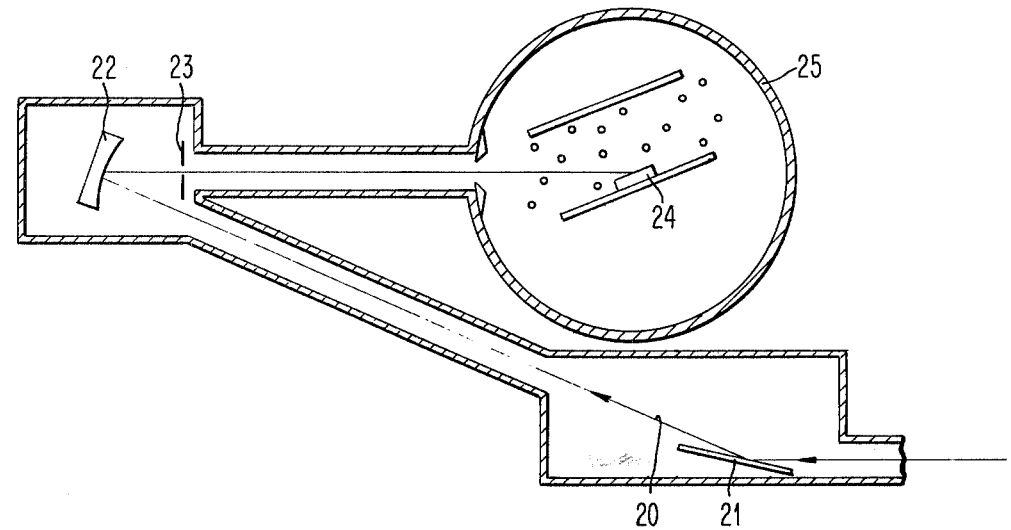
FIG. 2 is a schematic cross-sectional view of an alternative vacuum ultraviolet generating means in combination with the plasma reactor.

Alternatively, instead of employing the spark gap source of FIG. 1 as the means for generating the vacuum ultraviolet, a synchrotron (not shown) can be used to provide the beam 20 shown in FIG. 2. For example, a 180 MeV synchrotron as described in the Journal of Applied Physics 36, 380 (1965) emits an intense radiation continuum throughout the vacuum ultraviolet spectrum. Further details about this synchrotron and others can be found in that reference and in Techniques of Vacuum Ultraviolet Spectroscopy and the references cited therein and in Chemical Spectroscopy and Photochemistry in the Vacuum Ultraviolet. As shown in FIG. 2, the beam 20 from the synchrotron first is reflected off a pre-mirror 21 before striking a grating 22 of the monochromator and being reflected through an exit slit 23 onto the article 24 to be etched in the plasma reactor 25.

Figure 3:
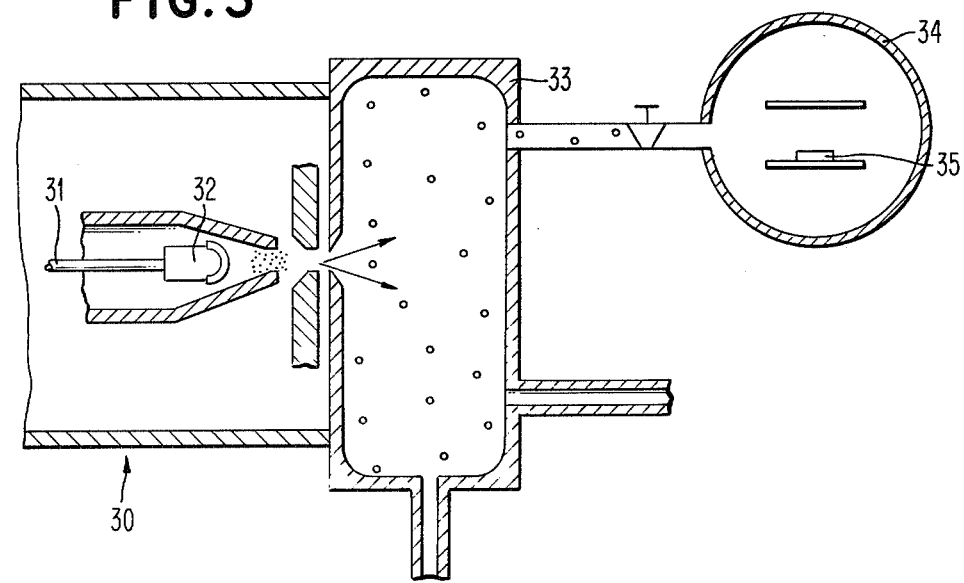
FIG. 3 is a schematic cross-sectional view of another alternate vacuum ultraviolet generating means in combination with the plasma reactor.

A further alternative embodiment is shown in FIG. 3 in which the etchant gas molecules are exposed to vacuum ultraviolet radiation so as to disassociate the molecules into reactive species prior to introducing the gas into the plasma reactor. In this embodiment, the vacuum ultraviolet source is a duoplasmatron 30 (partially shown), which emits line radiation depending on the gas introduced in the inlet 31 and present at the filament 32. Accordingly, the gas is selected for its emission line(s) so as to match the absorption spectra or disassociation energy of the gas molecules in the chamber 33, which are to be used as the plasma etchant. While not shown in this embodiment, it is desirable to use a monochromator as shown in FIG. 1, because the duoplasmatron also emits a continuum of wavelengths and it may be necessary to tune the emission to the disassociation energy of the gas molecules. After exposure to the vacuum ultraviolet radiations, the etchant gas now containing reactive species, such as fluorine atoms, is fed into the plasma reactor 34. The presence of the reactive species effects the etching rate so that controlling the formation of the reactive species in the chamber 33, the etching of the article 35 in the reactor 34 can be controlled. Further details on the duoplasmatron can be found in Techniques of Vacuum Ultraviolet Spectroscopy.

From the foregoing, it is apparent that the present invention provides the advantage of being able to select those plasma species desired for disassociation by tuning the monochromator to the disassociation energy of those species.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

Having thus described our invention, what we claim as new, and desire to secure by Letters Patent is:

1. A method for modifying a surface by either etching the surface or depositing a layer thereon which comprises the steps of, in either order, creating a plasma of reactive gas, and exposing a gas to vacuum ultraviolet of an energy such that the gas will be disassociated and of an intensity sufficient to disassociate the gas in sufficient quantity to permit control of the modification of the surface.

2. The method of claim 1 wherein the gas comprises a fluorinated hydrocarbon and oxygen.

3. The method of claim 1 wherein the gas comprises a fluorine atom precursor.

4. The method of claim 1 wherein the gas is a plasma and is exposed adjacent the surface to be modified.

5. The method of claim 4 wherein only the plasma adjacent selected portions of the surface are exposed, thereby modifying the surface in the exposed portion different from the unexposed portions of the surface.

6. The method of claim 1 wherein the gas is exposed prior to becoming a plasma.

7. The method of claim 1 wherein the gas contains different molecules and/or radicals, and wherein the energy of the vacuum ultraviolet is tuned to the disassociation energy of at least one but not all of the molecules and/or radicals.

8. The method of claim 7 wherein the gas is a plasma adjacent the surface to be modified.

9. The method of claim 7 wherein the plasma has yet to be created.

10. The method of claim 7 wherein the modification of surface is by etching.

11. An apparatus for modifying a surface by either etching the surface or depositing a layer thereon, comprising:
    source means for generating vacuum ultraviolet radiation;
    monochromator means for tuning the radiation to a predetermined energy;
    plasma reactor means adapted to modify the surface of articles with a plasma and having a supply chamber of gas for the plasma; and
    means for directing the tuned radiation to expose at least a portion of the gas, said radiation having an energy overlapping the disassociation energy of the gas, whereby tne gas disassociates into reactive species thereby permitting real time control of the modification of the surface.

12. The apparatus of claim 11 wherein the gas is exposed as a plasma adjacent the surface of the article to be modified.

13. The apparatus of claim 1 wherein the gas is exposed while in said chamber prior to becoming a plasma.

14. The apparatus of claim 1 wherein the means for generating vacuum ultraviolet radiation is a duoplasmatron.

15. The apparatus of claim 1 wherein the gas is $CF_4$ and $O_2$ and wherein the surface is modified by etching.

* * * * *

UNITED STATES PATENT AND TRADEMARK OFFICE
CERTIFICATE OF CORRECTION

PATENT NO. : 4,183,780
DATED : January 15, 1980
INVENTOR(S) : Charles M. McKenna and H. Keith Willcox It is certified that error appears in the above-identified patent and that said Letters Patent are hereby corrected as shown below:

Column 2, Line 15 (equation) - "30" should be -- 30 --.

Signed and Sealed this

Thirteenth Day of May 1980

[SEAL]

Attest:

SIDNEY A. DIAMOND

Attesting Officer

Commissioner of Patents and Trademarks